(12) United States Patent
Frank et al.

(10) Patent No.: US 8,101,517 B2
(45) Date of Patent: Jan. 24, 2012

(54) SEMICONDUCTOR DEVICE AND METHOD FOR MAKING SAME

(75) Inventors: Manfred Frank, Nittendorf (DE); Ivan Nikitin, Regensburg (DE); Thomas Kunstmann, Laaber (DE)

(73) Assignee: Infineon Technologies AG, Neubiberg (DE)

( * ) Notice: Subject to any disclaimer, the term of this patent is extended or adjusted under 35 U.S.C. 154(b) by 82 days.

(21) Appl. No.: 12/568,925

(22) Filed: Sep. 29, 2009

(65) Prior Publication Data

US 2011/0074040 A1  Mar. 31, 2011

(51) Int. Cl.
*H01L 21/00* (2006.01)

(52) U.S. Cl. ........ 438/629; 257/698; 257/702; 257/774; 438/672

(58) Field of Classification Search .................. 438/629, 438/672; 257/698, 702, 774, E21.597, E23.067
See application file for complete search history.

(56) References Cited

U.S. PATENT DOCUMENTS

| | | | |
|---|---|---|---|
| 6,303,464 B1 * | 10/2001 | Gaw et al. | 438/422 |
| 7,276,787 B2 * | 10/2007 | Edelstein et al. | 257/698 |
| 2005/0121768 A1 * | 6/2005 | Edelstein et al. | 257/698 |
| 2005/0148164 A1 | 7/2005 | Casey et al. | |
| 2006/0027934 A1 * | 2/2006 | Edelstein et al. | 257/774 |
| 2009/0302480 A1 | 12/2009 | Birner et al. | |
| 2010/0213571 A1 * | 8/2010 | Dyer et al. | 257/532 |

* cited by examiner

*Primary Examiner* — Fernando L Toledo

(74) *Attorney, Agent, or Firm* — Infineon Technologies; Philip Schlazer

(57) ABSTRACT

One or more embodiments may relate to a method for making a semiconductor structure, the method including: forming an opening at least partially through a workpiece; and forming an enclosed cavity within the opening, the forming the cavity comprising forming a paste within the opening.

36 Claims, 4 Drawing Sheets

SEMICONDUCTOR DEVICE AND METHOD FOR MAKING SAME

TECHNICAL FIELD

This invention relates generally to semiconductor structures and devices.

BACKGROUND

One of the goals in the fabrication of electronic components is to minimize the size of various components. For example, it is desirable that hand held devices such as cellular telephones and personal digital assistants (PDAs) be as small as possible. To achieve this goal, the semiconductor circuits that are included within the devices should be as small as possible. One way of making these circuits smaller is to stack the chips that carry the circuits.

A number of ways of interconnecting the chips within the stack are known. For example, bond pads formed at the surface of each chip can be wire-bonded, either to a common substrate or to other chips in the stack. Another example is a so-called micro-bump 3D package, where each chip includes a number of micro-bumps that are routed to a circuit board, e.g., along an outer edge of the chip.

Yet another way of interconnecting chips within the stack is to use through-substrate vias. Through-substrate vias extend through the substrate and are thereby capable of electrically interconnecting circuits on various chips. Through-substrate via interconnections may provide advantages in terms of interconnect density compared to other technologies. In addition to applications in 3D chip stacking, through-substrate via interconnections can be used to increase performance of RF and power devices by providing very low resistive ground contacts to wafer backside and advanced heat sink capability. However, introduction of such interconnects may introduce additional challenges.

The integration of chips in 3D brings forth a number of new challenges that need to be addressed. Hence, what is needed in the art are improved structures and methods of making through-substrate vias.

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

For through-substrate vias in semiconductor fabrication different fabrication schemes may be used. One option is the via first option which is to first etch the opening for the through-substrate via from the top of the wafer down, optionally insulate the opening, and then form a metal in the opening all before BEOL (back end of line) processing. The wafer backside is later ground and a backside contact is formed. Another option is the via from the backside option which is to first thin the wafer and then etch the opening for the through-silicon via from the backside of the wafer. The opening may then, optionally be insulated, and a metal may then be formed within the opening. A backside contact may then be formed. A possible advantage of the via first option may be to process more steps with thick silicon wafers while a possible advantage of the via from the backside option may be an easier integration into existing process flows.

Figure 1:
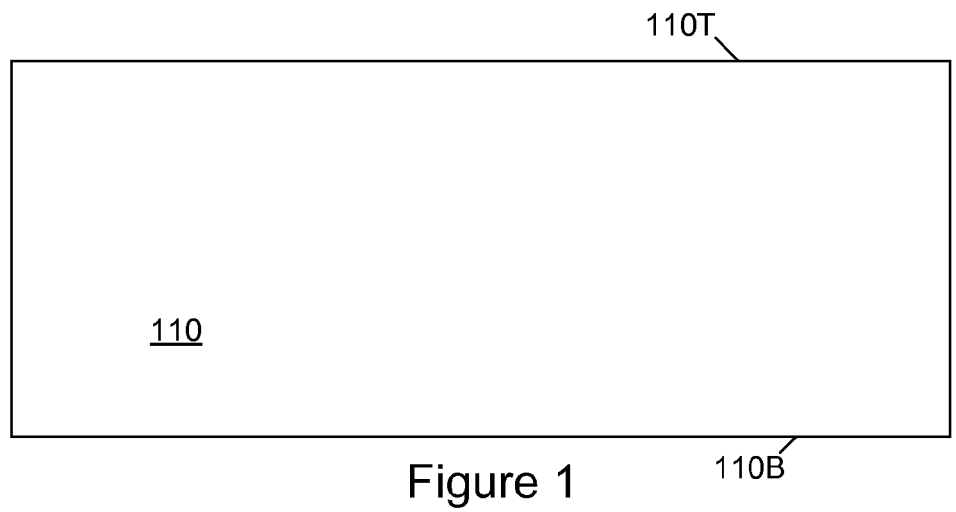
FIGS. 1 through 7 show a method of forming a semiconductor structure in accordance with embodiments of the present invention.

FIG. 1 shows a structure which comprises a workpiece 110. Referring to FIG. 1, a workpiece 110 may be provided. The workpiece 110 comprises a top surface 110T and a bottom surface 110B. In one or more embodiments, the workpiece 110 may be a substrate. The substrate may be any substrate. In one or more embodiments, the substrate 110 may be a semiconductor substrate. In one or more embodiments, the semiconductor substrate may be a silicon substrate (for example, bulk silicon). In an embodiment, the semiconductor substrate may be a p-type substrate. In one or more embodiments, the semiconductor substrate may, for example, be a bulk monocrystalline silicon substrate. In one or more embodiments, the semiconductor substrate may be a silicon-on-insulator (SOI) substrate. The SOI substrate may, for example, be formed by a SIMOX process. In one or more embodiments, the semiconductor substrate may be a silicon-on-sapphire (SOS) substrate. In one or more embodiments, the semiconductor substrate may be a germanium-on-insulator (GeOI) substrate. In one or more embodiments, the semiconductor substrate may include one or more semiconductor materials such as silicon, silicon germanium, germanium, germanium arsenide, indium arsenide, indium arsenide, indium gallium arsenide, or indium antimonide.

Figure 2:
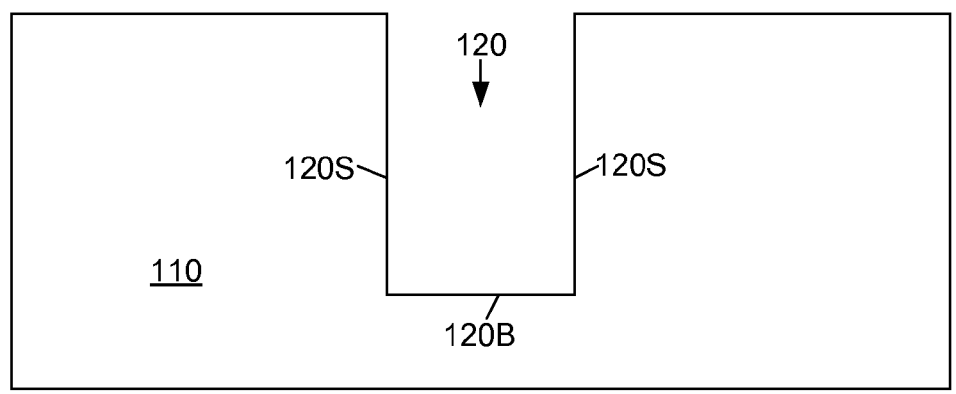

Referring to FIG. 2, an opening 120 is formed in the workpiece 110. The opening 120 may be formed at least partially through the workpiece 110. In the embodiment shown, the opening 120 goes only partially through the workpiece 110. However, in another embodiment, it is conceivable that an opening be formed that goes totally through the workpiece. In the embodiment shown, the opening 120 is in the form of a hole. In other embodiments, it is possible that the opening be in the form of a trench. The lateral cross section of the hole may have any shape such as round, oval, square or rectangular. The opening 120 shown in FIG. 2 has at least one sidewall surface 120S and a bottom surface 120B. In one or more embodiments (for example, when the opening 120 is a trench), the opening 120 may have two spacedly disposed sidewall surfaces.

Figure 3A:
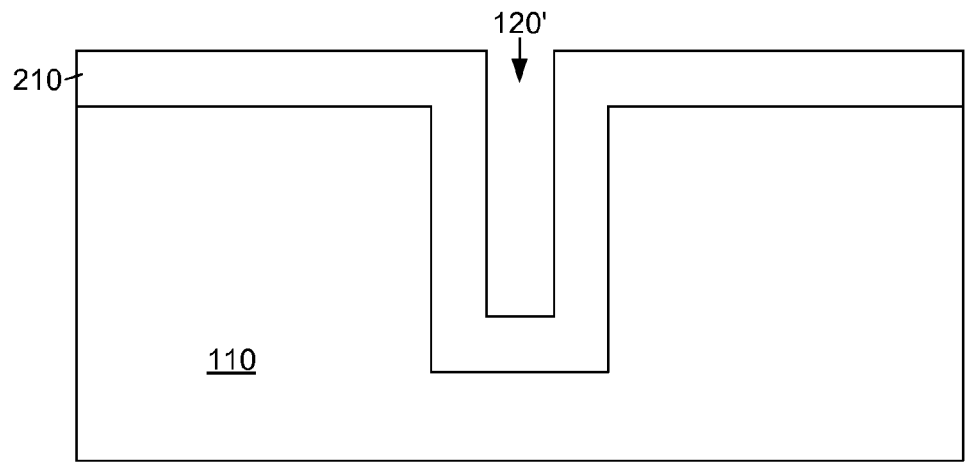

Referring to FIG. 3A, a layer 310 may be formed over the top surface of the workpiece 110 as well as within the opening 120. In one or more embodiments, the layer 310 may be formed so as to only partially fill the opening 120. Hence, a second opening 120' is formed within the opening 120. In one or more embodiments, the opening 120' may be smaller than the opening 120. For example, in one or more embodiments, the opening 120' may be narrower and/or shallower than the opening 120. In one or embodiments, the opening 120' may be narrower than the opening 120. In one or more embodiments, the opening 120' may be shallower than the opening 120.

In the embodiment shown in FIG. 3A, the formation of layer 210 may comprise at least one growth process and/or at least one deposition process. At least one of the deposition processes may be a substantially conformal deposition process. The layer 210 may be formed over the one or more sidewall surfaces 120S and the bottom surface 120B of the opening 120. In one or more embodiments, the layer 210 may itself comprise a stack of two or more layers (which may be referred to as sub-layers of the layer 210). As an example, the layer 210 may itself comprise at least one conductive layer and at least one non-conductive layer.

In one or more embodiments, the layer 210 may be a conductive layer. The conductive layer may itself comprise two or more conductive layers (e.g. sub-layers). In one or more embodiments, the layer 210 may be a metallic layer.

Figure 3B:
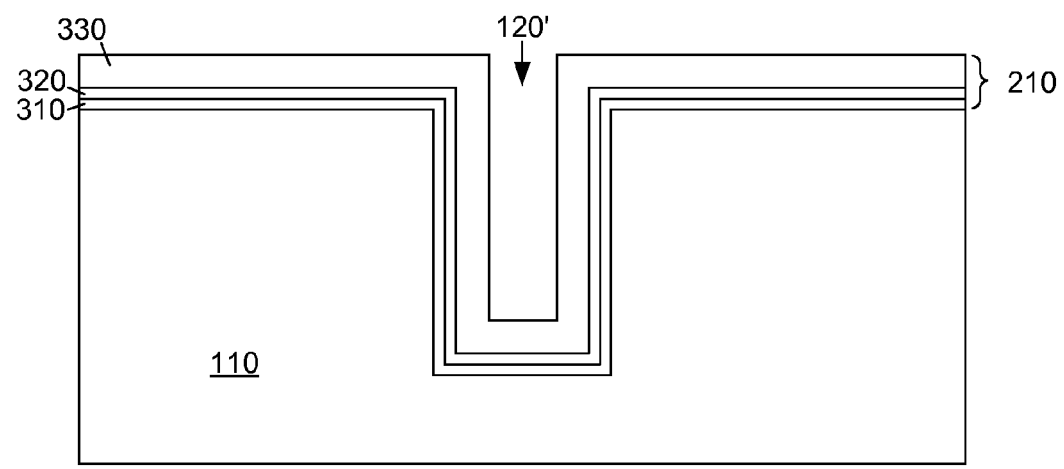

In the embodiment shown in FIG. 3B, the layer 210 is shown as a layered stack of layers 310, 320 and 330. However, in other embodiments, the layer 210 may include at least one of the layers 310, 320 and 330. In other embodiments, the layer 210 may include at least two of the layers 310, 320 and 330. In one or more embodiments, the layer 210 may include additional layers than the layers 310, 320 and 330.

Referring to FIG. 3B, in one or more embodiments, the layer 210 may include a barrier layer 310. A barrier layer 310 may be formed over the sidewall and bottom surfaces of the opening 120. The barrier layer 310 may be formed by a growth process or by deposition process. The deposition process may be a substantially conformal deposition process. In one or more embodiments, the barrier layer 310 may be a conductive layer and may comprise one or more conductive materials. In one or more embodiments, the barrier layer may be a metallic layer. In one or more embodiments, the barrier layer 310 may comprise one or more metallic materials. The metallic material may, for example, comprise one or more Periodic Table elements from the group consisting of copper (Cu), gold (Au), silver (Ag), aluminum (Al), tungsten (W), titanium (Ti), and tantalum (Ta). Examples of metallic materials include pure metals, metal alloys and metallic compounds. Examples of metallic materials include pure copper, copper alloy, pure gold, gold alloy, pure silver, silver alloy, pure aluminum, aluminum alloy, pure titanium, titanium alloy, pure tantalum, and tantalum alloy. It is, of course, understood that any pure metal may include some impurities. In one or more embodiments, the barrier layer 310 may comprise at least one material selected from the group consisting of Ti, TiN, Ta, TaN, and combinations thereof. In one or more embodiments, the barrier layer may comprise a Ti/TiN layer or a Ta/TaN layer. In one or more embodiments, the barrier layer 310 may comprise a pure metal and/or a metal alloy and/or a metallic compound.

In one or more embodiments, the layer 210 may include a seed layer 320. The seed layer 320 may be formed over the barrier layer 210 within the opening 120. The seed layer 320 may be formed by a growth process or by a deposition process. The deposition process may be a substantially conformal deposition process. In one or more embodiments, the seed layer 320 may comprise one or more conductive materials. In one or more embodiments, the seed layer may be a metallic material. In one or more embodiments, the seed layer 320 may comprise one or more metallic materials. The metallic material may, for example, comprise one or more Periodic Table elements from the group consisting of copper (Cu), gold (Au), silver (Ag), aluminum (Al), tungsten (W), titanium (Ti), and tantalum (Ta). Examples of metallic materials include pure metals, metal alloys and metallic compounds. Examples of metallic materials include pure copper, copper alloy, pure gold, gold alloy, pure silver, silver alloy, pure aluminum, aluminum alloy, pure titanium, titanium alloy, pure tantalum, and tantalum alloy. It is, of course, understood that any pure metal may include some impurities. In one or more embodiments, the seed layer may comprise a pure metal and/or a metal alloy and/or a metallic compound.

In one or more embodiments, the seed layer 320 may include pure copper and/or copper alloy. In one or more embodiments, the metallic seed layer may substantially lack pure copper. In one or more embodiments, the seed layer 320 may substantially lack a copper alloy. In one or more embodiments, the seed layer 320 may lack pure copper as well as a copper alloy.

The layer 210 may further include a fill layer 330. A fill layer 330 may be formed over the seed layer 320. The fill layer 330 may be formed over the seed layer 320 by a growth process or a deposition process. The deposition process may be a substantially conformal deposition process. The fill layer 330 may be formed by an electrodeposition process.

Generally, the fill layer 330 may be a conductive layer. The fill layer 330 may comprise one or more conductive materials. In one or more embodiments, the fill layer 330 may be a metallic layer. In one or more embodiments, the fill layer 330 may comprise one or more metallic materials. Examples of metallic materials include pure metals, metal alloys and metallic compounds. The metallic material may, for example, comprise one or more Periodic Table elements from the group consisting of copper (Cu), gold (Au), silver (Ag), aluminum (Al), tungsten (W), titanium (Ti), and tantalum (Ta). Examples of metallic materials include pure copper, copper alloy, pure gold, gold alloy, pure silver, silver alloy, pure aluminum, aluminum alloy, pure titanium, titanium alloy, pure tantalum, and tantalum alloy. It is, of course, understood that any pure metal may include some impurities. In one or more embodiments, the fill layer 330 may comprise a pure metal and/or a metal alloy and/or a metallic compound.

In one or more embodiments, the layer 210 may include one or more additional layers such as one or more conductive layers. These additional layers may, for example, be between the workpiece 110 and the barrier layer 310, or between the barrier layer 310 and seed layer 320, or between the seed layer 320 and fill layer 330, or overlying the fill layer 330. In one or more embodiments, it is possible that only one or two of the layer 310, 320, 330 are used. In one or more embodiments, it is possible that the barrier layer 310 and the fill layer 330 be used without the seed layer 320. In another embodiment, it is possible that the seed layer 320 and fill layer 330 be used without a separate barrier layer 310. In one or more embodiments, it is possible that a common layer be used as both a seed layer and as a barrier layer. In another embodiment, it is possible that a fill layer 330 be used without a barrier layer 310 and/or without a seed layer 320.

In one or more embodiments, the barrier layer 310, the seed layer 320 and the fill layer 330 may be applied so that the opening 120 is only partially filled. Hence, after the formation of the fill layer 330, another opening 120' remains. The opening 120' may be smaller than the opening 120. For example, in one or more embodiments, the opening 120' may be narrower (such as a smaller width) than the opening 120. In one or more embodiments, the opening 120' may be shallower than the opening 120. For example, in one or more embodiments, the opening 120' may be narrower (such as a smaller width) than the opening 120. In one or more embodiments, the opening 120' may be narrower and shallower than the opening 120.

Figure 4:
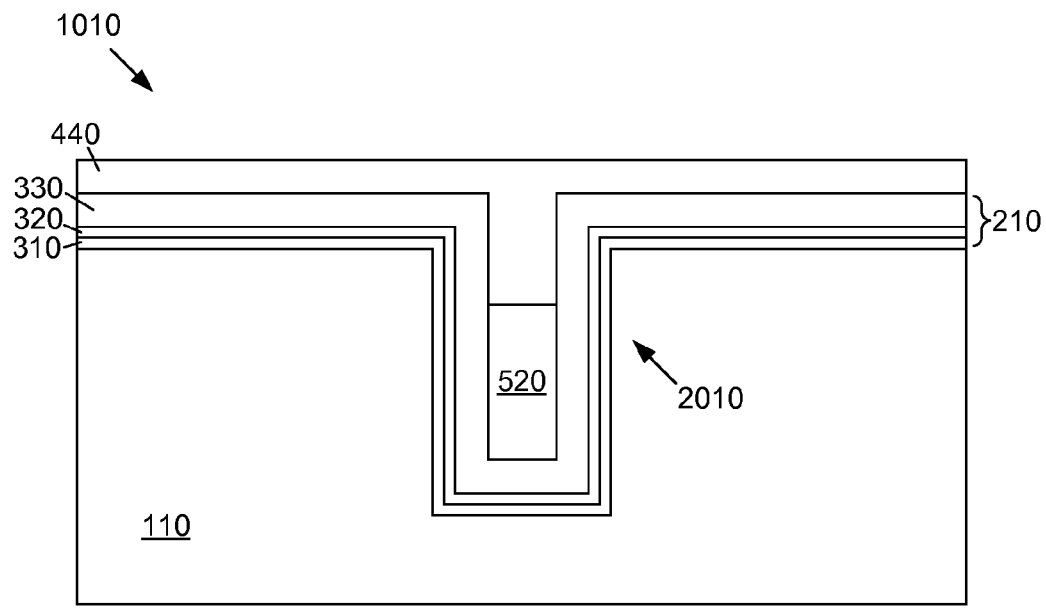

FIG. 4 shows a structure 1010. Referring to FIG. 4, a closing layer 440 may then be applied over the entrance of the opening 120' to substantially close the opening 120'. In one or more embodiments, the closing layer 120' may extend laterally over a lateral cross-section of the opening 120'. In the embodiment shown, the entrance may be at the top of the opening 120'. The closing layer 440 may substantially close the entrance (e.g. top) of the opening 120'. In one or more embodiments, the closing layer 440 may be applied by a deposition process.

Referring to FIG. 4, in one or more embodiments, the closing layer 440 may be disposed within only a portion (such as an upper portion) of the opening 120' and not fill the opening 120'. A portion 520 (such as a lower portion) of the opening 120' may remain that is not filled with the closing layer 440. The portion 520 of the opening 120' may be an enclosed cavity. Hence, the closing layer 440 may substantially close the opening 120' so as to form an enclosed cavity 520. In one or more embodiments, the enclosed cavity 520 may be an enclosed void.

In one or more embodiments, the closing layer 440 may at least partially fill the opening 120'. In one or more embodiments, the closing layer may only partially fill the opening 120'. In one or more embodiments, the closing layer 120' may substantially fill the opening 120'.

In one or more embodiments, the closing layer 440 may form at least a portion of the boundary (such as a top boundary) or border (such as a top border) that borders, encloses or surrounds the enclosed cavity 520. Hence, in one or more embodiments, at least a portion of the enclosed cavity 520 may be bordered, enclosed or surrounded by the closing layer 440.

In one or more embodiments, the enclosed cavity 520 may be substantially sealed. For example, in one or more embodiments, the enclosed cavity may be substantially sealed so that matter cannot enter the enclosed cavity. The matter may include one or more types selected from the group consisting of solid matter, liquid matter, and gaseous matter. In one or more embodiments, the matter may include solid matter. In one or more embodiments, the matter may include liquid matter. In one or more embodiments, the matter may include gaseous matter. The matter may come from subsequent processes (such as, for example, later CMP process steps). It is possible that such sealing may be important to prevent contaminates from entering the enclosed cavity. Such contaminates may poison or otherwise cause problems for conductive interconnects such as through-substrate vias. In one or more embodiments, the enclosed cavity may be substantially fluidly sealed (where a fluid may be a gas or a liquid). In one or more embodiments, the enclosed cavity may be substantially liquidly sealed. In one or more embodiments, the closing layer 440, as deposited, may substantially seal the enclosed cavity 520. In one or more embodiments, the closing layer 440, as deposited, may not substantially seal the closing layer 440. In one or more embodiments, the closing layer 440, as deposited, may be modified by a later processing step so that it may substantially seal the enclosed cavity 520.

In one or more embodiments, the closing layer 440 may comprise or consist essentially of a paste. In one or more embodiments, the closing layer 440 may be a paste.

In one or more embodiments, the paste may be a suspension. In one or more embodiments, the paste may be an aqueous suspension. In one or more embodiments, the paste may be a non-aqueous suspension.

In one or more embodiments, the paste may comprise at least one conductive material. In one or more embodiments, the paste may comprise at least one metallic material.

In one or more embodiments, the paste may comprise a conductive powder. The conductive powder may comprise a plurality of conductive particles. In one or more embodiments, the conductive particles may comprise or consist essentially of metallic particles. In one or more embodiments, the paste may comprise a metallic powder. The metallic powder may include a plurality of metallic particles. In one or more embodiments, the conductive particles may include a mixture of metallic particles and non-metallic conductive particles.

The paste may include non-conductive particles. The paste may include a mixture of conductive particles and non-conductive particles. The paste may include a mixture of metallic particles, non-metallic conductive particles and non-conductive particles.

In one or more embodiments, the conductive particles of the paste may have any shape. As an example, the particles may be substantially spherical particles. As another example, the particles may be elongated particles. As another example, the particles may be cylindrical. As another example, the particles may be ellipsoidal. As another example, the particles may be thread-like particles. The particles may include a mixture of two or more different types (for example, shapes) of particles.

In one or more embodiments, the conductive particles of the paste may include nano-particles and/or micro-particles. In one or more embodiments, the nano-particles may have a particle size less than 10 nm (nanometers). In one or more embodiments, the micro-particles may have a particle size greater than 10 nm. In one or more embodiments, the micro-particles may have a particle size greater than or equal to 10 nm.

In one or more embodiments, the nano-particles may have an average particle size of about 30 nm (nanometers) or less. In one or more embodiments, the nano-particles may have an average particle size of about 20 nm or less. In one or more embodiments, the nano-particles may have an average particle size of about 15 nm or less. In one or more embodiments, the nano-particles may have an average particle size of about 10 nm or less. In one or more embodiments, the nano-particles may have an average particle size between about 20 nm and about 5 nm.

In one or more embodiments, the micro-particles may have an average particle size of about 500 nm or greater. In one or more embodiments, the micro-particles may have an average particle size of about 750 nm or greater. In one or more embodiments, the micro-particles may have an average particle size of about 1000 nm or greater. In one or more embodiments, the micro-particles may have an average particle size of about 1250 nm or greater.

In one or more embodiments, the micro-particles may have an average particle size of about 500 nm or greater. In one or more embodiments, the micro-particles may have an average particle size of about 1000 nm or greater. In one or more embodiments, the micro-particles may have an average particle size of about 2000 nm or greater. In one or more embodiments, the micro-particles may have an average particle size of about 5000 nm or greater. In one or more embodiments, the micro-particles may have an average particle size of about 1000 nm or greater.

In one or more embodiments, the conductive particles may include nano-particles and micro-particles. In one or more embodiments, the conductive particles may consist essentially of nano-particles and micro-particles. In one or more embodiments, the conductive particles may be a mixture of particles comprising nano-particles and micro-particles. In one or more embodiments, the conductive particles may be a mixture of conductive particles consisting essentially of nano-particles and micro-particles.

In one or more embodiments, the conductive particles may include between about 10% and about 100% nano-particles (in one or more embodiments, the remainder of the conductive particles may be micro-particles). In one or more embodiments, the conductive particles may include between about 10% and about 50% nano-particles (in one or more embodiments, the remainder of the conductive particles may be micro-particles). In one or more embodiments, the conductive particles may include between about 10% and about 30% nano-particles (in one or more embodiments, the remainder of the conductive particles may be micro-particles). In one or more embodiments, the conductive particles may include about 15-25% nano-particles (in one or more embodiments, the remainder of the conductive particles may be micro-particles). In one or more embodiments, the conductive particles of the paste may include about 20% nano-particles (in one or more embodiments, the remainder of the conductive particles may be micro-particles). In one or more embodiments, the conductive particles may include about 80% micro-particles.

While not wishing to be bound by theory, is possible that a paste having too high of a percentage of nano-particles may have too much shrinkage after the paste is dried and/or sintered. It may also be possible that too many cracks in the paste may occur. While not wishing to be bound by theory, it is also possible that a paste having to small of a percentage of nano-particles may not appropriately sinter or that sintering may be incomplete. It is possible that the possible additional micro-particles may have insufficient adhesion to each other and may drop out. Such insufficient sintering may become an even greater problem at sintering temperatures between about 150° C. and about 300° C.

In one or more embodiments, the conductive particles of the paste may have an average particle size of at least about 1 nm nanometer. In some embodiments, the particles may have an average particle size of at least about 5 nm. In some embodiments, the particles may have an average particle size of at least about 10 nm. In some embodiments, the particles may have an average particle size of at least about 20 nm. In some embodiments, the particles may have an average particle size of at least 50 nm. In some embodiments, the particles may have an average particle size of at least 70 nm. In some embodiments, the particles may have an average particle size of at least 80 nm. In some embodiments, the particles may have an average particle size of at least 100 nm. In some embodiments, the particles may have an average particle size of at least 150 nm. In some embodiments, the particles may have an average particle size of at least 200 nm.

In one or more embodiments, the conductive particles of the paste may have an average particle size of about 10000 nm or less. In one or more embodiments, the conductive particles may have an average particle size of about 5000 nm or less. In one or more embodiments, the conductive particles may have an average particle size of about 1000 nm or less. In one or more embodiments, the conductive particles may have an average size of about 500 nm (nanometers) or less. In one or more embodiments, the conductive particles may have an average size of about 200 nm or less. In one or more embodiments, the particles may have an average size of about 100 nm or less. In one or more embodiments, the conductive particles may have an average size of about 70 nm or less. In one or more embodiments, the particles may have an average size of about 50 nm or less. In one or more embodiments, the conductive particles may have an average size of about 20 nm or less. In one or more embodiments, the conductive particles may have an average size of about 15 nm or less. In one or more embodiments, the conductive particles may have an average size of about 10 nm or less. In one or more embodiments, the conductive particles may have an average size of about 5 nm or less. In one or more embodiments, the conductive particles may have an average size of about 1 nm or less.

The paste may further include a base resin. In one or more embodiments, the base resin may be one or more materials chosen from the group consisting of butyl carbitol, phenol resin, epoxy resin, and mixtures thereof. The paste may further include a solvent. In one or more embodiments, the solvent may be water based. In one or more embodiments, the solvent may be alcohol based. In one or more embodiments, the solvent may comprise, for example, alpha-terpineol.

In one or more embodiments, the conductive particles of the paste may comprise or consist essentially of metallic particles. In one or more embodiments, the conductive particles of the paste are metallic particles. In one or more embodiments, the conductive power may comprise a metallic powder. In one or more embodiments, the conductive power may consist essentially of a metallic powder. In one or more embodiments, the conductive powder of the paste may be a metallic powder comprising metallic particles.

In one or more embodiments, one or more of the metallic particles may each comprise one or more metallic materials. Examples of metallic materials which may be used include, without limitation, pure metals, metal alloys and metallic compounds. In one or more embodiments, a metallic particle may comprise a pure metal and/or a metal alloy and/or a metallic compound.

In one or more embodiments, one or more of the metallic particles may each comprise a mixture (such as a heterogeneous mixture) of two or more metallic materials. A metallic particle may comprise a composite material comprising two or more metallic materials. Examples of metallic materials which may be used include, without limitation, pure metals, metal alloys and metallic compounds. In one or more embodiments, a metallic particle may comprise a mixture of a first pure metal and a second pure metal. In one or more embodiments, a metallic particle may comprise a mixture of a pure metal and a metal alloy. In one or more embodiments, a metallic particle may comprise a mixture of a pure metal and a metallic compound. In one or more embodiments, a metallic particle may comprise a mixture of a metallic compound and a metal alloy. In one or more embodiments, a metallic particle may comprise a mixture of a pure metal, a metal alloy and a metallic compound.

In one or more embodiments, one or more of the metallic particles may each consist essentially of a pure metal. In one or more embodiments, one or more of the metallic particles may each consist essentially of a metallic alloy. In one or more embodiments, one or more of the metallic particles may each consist essentially of a metallic compound.

In one or more embodiments, the metallic particles may be a mixture of different metallic particles. For examples, one or more metallic particles of the metallic powder may each comprise a first metallic material while one or more particles of the powder may each comprise a second metallic material different from the first metallic material.

In one or more embodiments, a paste may include a mixture of first pure metal particles and second pure metal particles. In one or more embodiments, a paste may include a mixture of pure metal particles and metal alloy particles. As an example, the paste may include a mixture of pure silver particles and pure gold particles. As another example, the paste may include a mixture of pure silver particles and silver alloy particles. As another example, the paste may include a mixture of pure silver particle and copper alloy particles.

The metallic materials may include one or more Periodic Table elements from the group consisting of copper (Cu), gold (Au), silver (Ag), aluminum (Al), tungsten (W), titanium (Ti), and tantalum (Ta). Examples of metallic materials include pure copper, copper alloy, pure gold, gold alloy, pure silver, silver alloy, pure aluminum, aluminum alloy, pure tungsten, tungsten alloy, pure titanium, titanium alloy, pure tantalum, and tantalum alloy. It is, of course, understood that any pure metal may include some impurities.

In one or more embodiments, one or more of the metallic particles may each consist essentially of pure silver and/or a silver alloy. In one or more embodiments, one or more of the metallic particles may each consist essentially of pure copper and/or a copper alloy. In one or more embodiments, one or more of the metallic particles may each consist essentially of pure gold and/or a gold alloy. In one or more embodiments, one or more of the metallic particles may each consist essentially of pure aluminum and/or a aluminum alloy. In one or more embodiments, one or more of the metallic particles may each consist essentially of pure tungsten and/or a tungsten alloy. In one or more embodiments, one or more of the metallic particles may each consist essentially of pure titanium and/or a titanium alloy. In one or more embodiments, one or more of the metallic particles may each consist essentially of pure tantalum and/or a tantalum alloy.

In one or more embodiments, the paste may comprise pure silver particles and/or silver alloy particles. In one or more embodiments, the paste may comprise pure silver particles. In one or more embodiments, the paste may comprise silver alloy particles. In one or more embodiments, the metallic particles of the paste may consist essentially of pure silver particles and/or silver alloy particles. In one or more embodiments, the metallic particles of the paste may consist essentially of pure silver particles. In one or more embodiments, the metallic particles of the paste may consist essentially of silver alloy particles.

In one or more embodiments, the paste may comprise pure gold particles and/or gold alloy particles. In one or more embodiments, the paste may comprise pure copper particles and/or copper alloy particles. In one or more embodiments, the paste may comprise pure aluminum particles and/or aluminum alloy particles. In one or more embodiments, the paste may comprise pure tungsten particles and/or tungsten alloy particles. In one or more embodiments, the paste may comprise pure titanium particles and/or titanium alloy particles. In one or more embodiments, the paste may comprise pure tantalum particles and/or tantalum alloy particles.

In one or more embodiments, it is possible that the metallic material used for the metallic particles include at least one metallic element and at least one non-metallic element. Examples of materials may include TiN, TaN, and WN. In one or more embodiments, the metallic material may be a metallic compound.

In one or more embodiments, the paste may be deposited in a non-conductive state. In one or more embodiments, the paste may then in some way modified to a conductive state at a later processing step. However, in one or more embodiments, the paste may also be left in a non-conductive state and not changed to a conductive state.

In one or more embodiments, the paste may be deposited in a conductive state. In one or more embodiments, a paste deposited in a conductive state remains in a conductive state. In one or more embodiments, it is possible that a paste deposited in a conductive state may be changed to a non-conductive state in a later processing step.

The paste may be applied in many ways. In one or more embodiments, the paste may be applied by a printing process over the substrate surface and over the opening 120'. The printing process may be a stencil printing process. In one or more embodiments, a direct dispensing process may be used to apply the paste. The paste may be applied in other ways as well.

The closing layer 440 (which may be a paste) may go within the opening 120' due to mechanical pressure. The mechanical pressure may, for example, be from the printing process, from gravity and/or from the difference in the pressure inside the opening 120' and the pressure outside the opening 120'. Printing may be accomplished with the help of mechanical means. For example, the paste may be scraped. The scraping may be done with the use of a scraper (such as a rubber scraper). The scraping may be done in at least two directions. The scraping may be done in the presence of air. The scraping may be done by hand.

After the printing process is complete, the closing layer 440 (e.g. paste), may be dried and/or sintered. The paste may first be dried. The drying may take place in a furnace. In some embodiments, the drying process may be done in temperatures of about 150° C. or less. In some embodiments, the drying may be done in temperatures of about 125° C. or less. In some embodiments, the drying may be done in temperatures of about 115° C. or less. In some embodiments, the drying may be done in temperatures of about 110° C. or less. In some embodiments, the drying may be done in temperatures of about 105° C. or less. In some embodiments, the drying may be done in temperatures of about 100° C. or less.

The drying process may have a time period between about 1 minute and about 4 hours. In some embodiments, the drying time may be about 30 minutes or less. In some embodiments, the drying time may be about 20 minutes or less. In some embodiments, the drying time may be about 15 minutes or less.

In one or more embodiments, the temperature of the sintering process may be about 100° C. or greater. In one or more embodiments, the temperature of the sintering process may be about 150° C. or greater. In one or more embodiments, the temperature of the sintering process may be about 200° C. or greater. In one or more embodiments, the temperature of the sintering process may be about 250° C. or greater. In one or more embodiments, the temperature of the sintering process may be about 300° C. or greater. In one or more embodiments, the temperature of the sintering process may be about 350° C. or greater. In one or more embodiments, the temperature of the sintering process may be about 400° C. or greater. In one or more embodiments, the temperature of the sintering process may be about 500° C. or less. In one or more embodiments, the temperature of the sintering process may be about 400° C. or less.

In one or more embodiments, the duration of the sintering process may be between 1 minute and 4 hours. In one or more embodiments, the duration of the sintering process may be for about 10 minutes or longer. In one or more embodiments, the duration of the sintering process may be for about 5 minutes or longer. In one or more embodiments, the duration of the sintering process may be for about 15 minutes or longer. In one or more embodiments, the duration of the sintering process may be for about 20 minutes or longer. In one or more embodiments, the duration of the sintering process may be for about 30 minutes or longer. The sintering process may take place in a forming gas atmosphere. The forming gas may avoid oxidation within the via. This may be especially useful when either pure copper and/or copper alloy is applied to the substrate prior to the sintering process.

In one or more embodiments, the sintering process may modify the closing layer 440. As noted, in one or more embodiments, the closing layer 440 may be a paste. In one or more embodiments, the conductive powder of the paste may be a metallic powder comprising metallic particles. The sintering process may form pores within the metallic particles and/or between the metallic particles. In one or more embodiments, the sintering process may cause the metallic particles of the paste to form into a continuous metallic network. In one or more embodiments, the sintering process may cause the metallic particles of the paste to become a porous metallic layer or block. In one or more embodiments, the porous metallic layer may include between about 5% and about 50% porous space. In one or more embodiments, the sintering process may cause the metallic particles of the paste to form a sponge-like metallic layer. In one or more embodiments, after the sintering process, the closing layer 440 may no longer be a paste.

In one or more embodiments, the paste may be both dried and sintered and the sintering process may take place after the drying process.

In one or more embodiments, the sintering process may cause the enclosed cavity 520 to become substantially sealed. This may, for example, result from the resulting modification of the paste such as the sintering of metallic particles. For example, in one or more embodiments, the enclosed cavity may become a substantially sealed so that matter cannot enter the enclosed cavity. The matter may include one or more types selected from the group consisting of solid matter, liquid matter, and gaseous matter. In one or more embodiments, the matter may include solid matter. In one or more embodiments, the matter may include liquid matter. In one or more embodiments, the matter may include gaseous matter. The matter may come from subsequent processes (such as, for example, later CMP process steps). It is possible that such sealing may be important to prevent contaminates from entering the enclosed cavity. Such contaminates may poison or otherwise cause problems for conductive interconnects such as through-substrate vias. In one or more embodiments, the enclosed cavity may be substantially fluidly sealed (where a fluid may be a gas or a liquid). In one or more embodiments, the enclosed cavity may be substantially liquidly sealed.

FIG. 4 shows a structure 1010. The structure 1010 includes a conductive interconnect 2010. FIG. 4 shows a conductive interconnect 2010 which goes partially through the workpiece 110. In another embodiment, the conductive interconnect 2010 may be made to go completely through the workpiece 110. In one or more embodiments, another closing layer (which may again be a paste) may again be applied and/or the sintering process may be repeated.

Figure 5:
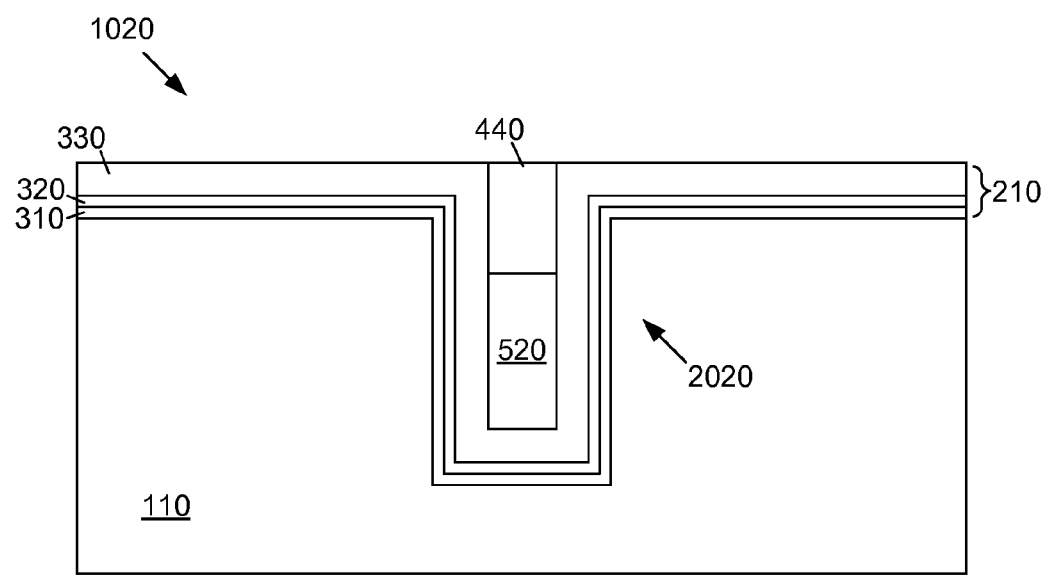

FIG. 5 shows a structure 1020. Referring to FIG. 5, in one or more embodiments, a portion of the closing layer 440 may be removed. The removed portion may include that which overlies the top surface of the fill layer 330. The removal process may include an etch process. In one or more embodiments, the etch process may include a dry etch process. In one or more embodiments, the etch process may include a wet etch process. In one or more embodiments, the etch process may include both a dry etch process and a wet etch process. In one or more embodiments, the etch process may include an etchback process. The dry etch process may include a dry etchback process. The dry etch process may include a plasma process. The dry etch process may include a reactive ion etch (RIE). The wet etch process may include a wet etchback process. The removal may also be accomplished using a chemical mechanical polishing process (a CMP process). The CMP process may be used with or without an etch process.

The remaining portion of the closing layer 440 may form a plug or stopper for the opening 120' which may close the opening 120' and form a closed cavity 520. In one or more embodiments the closing layer 440 (for example, after sintering) may additional seal the closed cavity 520. In one or more embodiments, the closing layer 440 as shown in FIG. 5, may occupy an upper or top portion of the opening 120' while the enclosed cavity 520 may occupy a lower or bottom portion. In one or more embodiments, the volume of the portion of the opening 120' occupied by the enclosed cavity 520 may be greater than the volume of the portion of the opening 120' occupied by the closing layer 440.

Referring to FIG. 5, in one or more embodiments, there may be a bottom portion of the opening 120' which lacks the closing layer 440. In one or more embodiments, the height of empty bottom portion may be at least about 10% of the height of the opening 120'. In one or more embodiments, the height of the empty portion may be at least about 20% of height of the opening 120'. In one or more embodiments, the height of the empty portion may be at least about 30% of the height of the opening 120'. In one or more embodiments, the height of the empty portion may be at least about 50% of the height of the opening 120'.

In one or more embodiments, the top surface of closing layer 440 may be flush with the top of the opening 120' (or top surface of layer 330). In one or more embodiments, the remaining portion of the closing layer 440 may be pushed further down the opening 120' and may not necessarily flush with the top of the opening 120' or with the layer 330. FIG. 5 shows a conductive interconnect 2020 which goes partially through the workpiece 110. In another embodiment, the conductive interconnect 2020 may be made to go completely through the workpiece 110.

Once again, referring to FIG. 5, it is possible that in another embodiment, the closing layer 440 may substantially fill the opening 120'.

Figure 6:
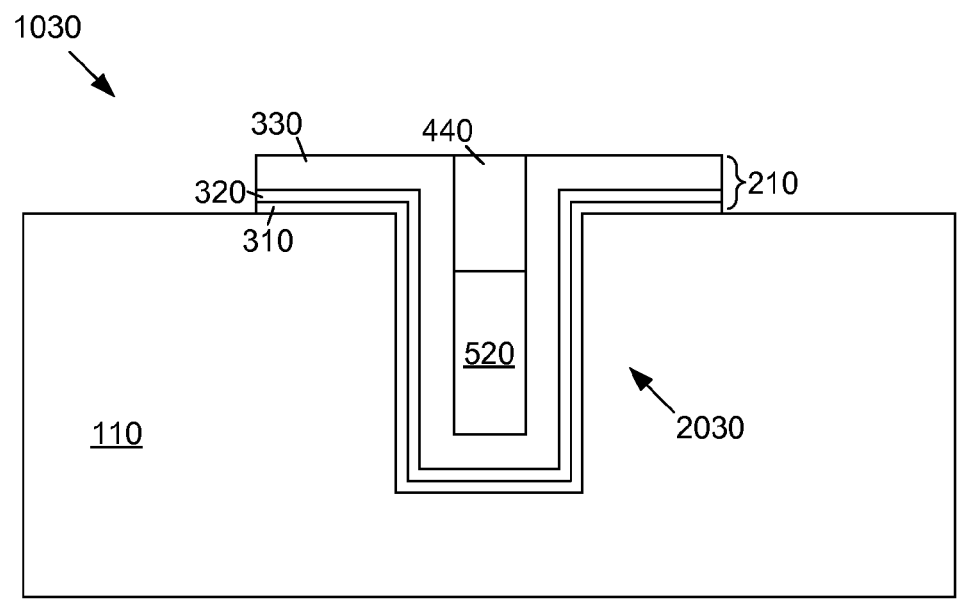

A structure 1030 is shown in FIG. 6. The structure 130 includes a conductive interconnect 2030. Referring to FIG. 6, in an optional step, it is possible that a peripheral portion of the stack 210 of layers 210, 220 and 230 may be removed, perhaps, by an etching process (such as a dry etching process). This processing step may be performed elsewhere in the process. In one or more embodiments, the peripheral portion of the stack 310 may instead be removed after the structure shown in FIG. 3A,B is formed but before the structure 1010 shown in FIG. 4 is formed. In one or more embodiments, the peripheral portion of the stack 310 may instead be removed after the structure 1010 shown in FIG. 4 is formed but before the structure 1020 shown in FIG. 5 is formed. FIG. 6 shows a conductive interconnect 2030. In the embodiment shown, the conductive interconnect 2030 goes only partially through the workpiece 110. In another embodiment, the conductive interconnect 2030 may be made to go completely through the workpiece 110.

Figure 7:
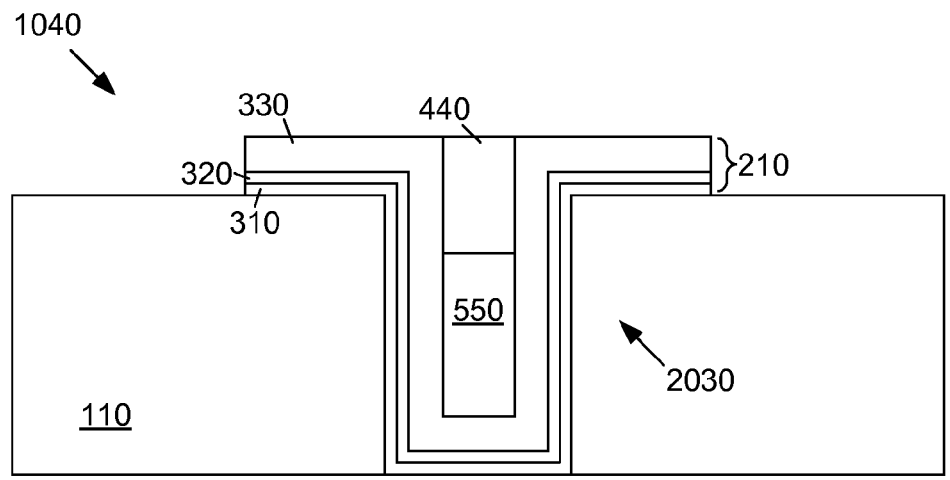

FIG. 7 shows a structure 1040. Referring to FIG. 7, in one or more embodiments, a portion of the workpiece 110 may be removed so that the conductive interconnect 2030 is exposed. Referring to FIG. 7, a portion of the workpiece 110 (which, in one or more embodiments, may be a substrate such as a semiconductor substrate) may be removed so that a bottom surface of conductive interconnect 2030 is exposed. For example, the workpiece 110 may be subjected to a backside grinding process and then, optionally, to a backside chemical mechanical polishing process to form the structure shown in FIG. 7. In the embodiment shown in FIG. 7, the buffer layer 310 is exposed. However, in another embodiment, the seed layer 320 may be exposed. In yet another embodiment, the fill layer 330 may be exposed. In alternate embodiments, it is possible that the grinding and/or chemical mechanical polishing process may be continued to expose other portions of the conductive interconnect 2030. FIG. 7 shows the conductive interconnect 2030 which goes completely through the workpiece 110 so that a conductive pathway between the top and bottom surfaces of the workpiece 110 may be formed. A conductive interconnect going completely through a substrate (such as a semiconductor substrate) may be referred to a through-substrate via.

In another embodiment, the structure 1010 shown in FIG. 4 may be subjected to a backside grinding process and then, optionally, to a backside chemical mechanical polishing process to form a conductive interconnect which also goes completely through the workpiece 110. A conductive pathway between the top and bottom surfaces of the workpiece 110 may be formed.

In another embodiment, the structure 1020 shown in FIG. 5 may be subjected to a backside grinding process and then, optionally, to a backside chemical mechanical polishing process to form a conductive interconnect which also goes completely through the workpiece 110. A conductive pathway between the top and bottom surfaces of the workpiece 110 may be formed.

In one or more embodiments, the structure 1010 shown in FIG. 4, the structure 1020 shown in FIG. 5, the structure 1030 shown in FIG. 6 and/or the structure 1040 shown in FIG. 7 may represent, for example, a semiconductor chip or at least a portion of a semiconductor chip. The semiconductor chip may include an integrated circuit and the conductive interconnects 2010, 2020, 2030 may be part of the integrated circuit. In one or more embodiments, the structure 1010 shown in FIG. 4, the structure 1020 shown in FIG. 5, the structure 1030 shown in FIG. 6 and/or the structure 1040 shown in FIG. 7 may represent, for example, a semiconductor structure or semiconductor device, or it may represent at least a portion of a semiconductor structure or semiconductor device.

In one or more embodiments, the workpiece 110 may be a substrate (such as a semiconductor substrate). However, in one or more embodiments, the workpiece 110 may represent any layer or combination of layers (such as a stack of layers) that may be used in a semiconductor device. The workpiece 110 may, for example, be a dielectric layer or a conductive layer. In one or more embodiments, the workpiece may comprise a semiconductor layer. The workpiece 110 may, for example, comprise one or more of any combination of layers of materials. In one or more embodiments, the workpiece 110 may overlie a substrate (such as a semiconductor substrate). In one or more embodiments, the workpiece 110 may include (or may be) a dielectric layer overlying a substrate (such as a semiconductor substrate). In one or more embodiments, the workpiece 110 may include (or may be) a inter-level dielectric layer.

Hence, the method described herein may be useful for closing and, optionally, substantially sealing any type of opening formed in any workpiece in a semiconductor device or structure. As an example, in one or more embodiments, referring to the FIGS. 1 through 7, it is possible that at least one (or all) of the sub-layers 310, 320, 330 of the conductive layer 210 be removed from the process described.

One or more embodiments may relate to a method for making a semiconductor structure, the method comprising: forming an opening at least partially through a workpiece; and forming an enclosed cavity within the opening, the forming the cavity comprising forming a paste within the opening.

One or more embodiments may relate to a method for making a semiconductor structure, the method comprising: forming an opening at least partially through a workpiece; and forming a paste partially within the opening.

One or more embodiments may relate to a semiconductor device, comprising: a workpiece having an opening at least partially therethrough; an enclosed cavity disposed within the opening; and a paste at least partially enclosing the enclosed cavity. In one or more embodiments only a portion of the enclosed cavity may be enclosed by sintered metallic particles. In one or more embodiments only a portion of the enclosed cavity may be enclosed by sintered metallic particles.

One or more embodiments may relate to a semiconductor device, comprising: a substrate; and a conductive interconnect extending at least partially through the substrate, the conductive interconnect including an enclosed cavity, at least a portion of the enclosed cavity enclosed by sintered metallic particles. In one or more embodiments only a portion of the enclosed cavity may be enclosed by sintered metallic particles.

In one or more embodiments, it is possible that one or more embodiments of the methods described herein may provide a more cost effective and/or efficient means of sealing an opening, of making one or more semiconductor structures, and/or of making conductive interconnects (such as, for example, through silicon vias).

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for making a semiconductor structure, the method comprising:
   forming an opening at least partially through a workpiece; and
   forming an enclosed cavity within said opening, said forming said cavity comprising forming a paste within said opening, said paste bordering a portion of said cavity, said portion being less than the entire cavity.

2. The method of claim 1, wherein forming said enclosed cavity further comprises sintering said paste.

3. The method of claim 1, wherein said paste comprises at least one conductive material.

4. The method of claim 1, wherein said paste comprises conductive particles.

5. The method of claim 4, wherein said conductive particles include between 10% and 100% nano-particles having a particle size of about 100 nm or less.

6. The method of claim 5, wherein said conductive particles include between 10% and 50% of said nano-particles.

7. The method of claim 5, wherein said conductive particles include micro-particles having a particle size greater than 100 nm.

8. The method of claim 7, wherein said nano-particles have an average particle size of 30 nm or less.

9. The method of claim 8, wherein said micro-particles have an average particle size of 500 nm or greater.

10. The method of claim 1, further comprising forming a conductive layer within said opening before forming said paste, said conductive layer formed over a sidewall of said opening.

11. The method of claim 1, wherein said workpiece is a substrate.

12. The method of claim 1, wherein said workpiece is a dielectric layer, said dielectric layer overlying a substrate.

13. A method for making a semiconductor structure, the method comprising:
   forming an opening at least partially through a workpiece, said opening having a sidewall surface; and
   forming a paste partially within said opening, said paste contacting an upper portion of said sidewall surface but not a lower portion of said sidewall surface.

14. The method of claim 13, further comprising sintering said paste.

15. The method of claim 13, wherein said paste closes said opening.

16. The method of claim 13, wherein said paste comprises at least one conductive material.

17. The method of claim 13, wherein said paste comprises conductive particles.

18. The method of claim 17, wherein said conductive particles include between 10% and 100% nano-particles having a particle size of about 100 nm or less.

19. The method of claim 17, wherein said conductive particles include between 10% and 50% of said nano-particles.

20. The method of claim 17, wherein said conductive particles include micro-particles having a particle size greater than 100 nm.

21. The method of claim 20, wherein said nano-particles have an average particle size of 30 nm or less.

22. The method of claim 21, wherein and said micro-particles have an average particle size of 500 nm or greater.

23. The method of claim 17, wherein said conductive particles are metallic particles.

24. The method of claim 13, wherein said workpiece is a semiconductor substrate.

25. The method of claim 13, wherein said workpiece is a dielectric layer, said dielectric layer overlying a substrate.

26. A semiconductor device, comprising:
   a workpiece having an opening at least partially therethrough; and
   an enclosed cavity disposed within said opening, said enclosed cavity being only partially enclosed by a conductive paste.

27. The device of claim 26, wherein said workpiece is a substrate.

28. A semiconductor device, comprising:
   a substrate; and
   a conductive interconnect extending at least partially through said substrate, said conductive interconnect including an enclosed cavity, said enclosed cavity being only partially enclosed by a conductive paste.

29. The device of claim 28, wherein said conductive interconnect is a through-substrate via.

30. The device of claim 26, wherein said paste borders a top portion of said cavity.

31. The device of claim 26, wherein said conductive paste. comprises a metallic paste.

32. The device of claim 28, wherein said conductive paste comprises sintered metallic particles.

33. The device of claim 28, wherein said paste borders a top portion of said cavity.

34. The device of claim 28, wherein said conductive paste comprises a metallic paste.

35. The device of claim 26, wherein said conductive paste comprises sintered metallic particles.

36. The device of claim 1, wherein said paste borders a top portion of said cavity.

* * * * *